(12) United States Patent
Kim et al.

(10) Patent No.: US 7,866,341 B2
(45) Date of Patent: Jan. 11, 2011

(54) VACUUM PUMPING SYSTEM, DRIVING METHOD THEREOF, APPARATUS HAVING THE SAME, AND METHOD OF TRANSFERRING SUBSTRATE USING THE SAME

(75) Inventors: Hong-Seub Kim, Gyeonggi-do (KR); Hyun-Soo Park, Incheon (KR); Soon-Bin Jung, Gyeonggi-do (KR); Sung-Ho Cha, Seoul (KR); Dong-Jin Kim, Gyeonggi-do (KR); Wook-Jung Hwang, Gyeonggi-do (KR); Jin-Hyuk Yoo, Gyeonggi-do (KR)

(73) Assignee: Jusung Engineering Co., Ltd., Gwangju-si, Gyeonggi-do (KR)

( * ) Notice: Subject to any disclaimer, the term of this patent is extended or adjusted under 35 U.S.C. 154(b) by 0 days.

(21) Appl. No.: 12/713,136

(22) Filed: Feb. 25, 2010

(65) Prior Publication Data

US 2010/0215513 A1    Aug. 26, 2010

Related U.S. Application Data

(62) Division of application No. 11/076,512, filed on Mar. 8, 2005, now Pat. No. 7,695,231.

(30) Foreign Application Priority Data

| Mar. 8, 2004 | (KR) | ............................ 2004-0015544 |
| Mar. 16, 2004 | (KR) | ............................ 2004-0017627 |
| Mar. 17, 2004 | (KR) | ............................ 2004-0017832 |
| Feb. 23, 2005 | (KR) | ............................ 2005-0014819 |

(51) Int. Cl.
*H01L 21/205* (2006.01)
(52) U.S. Cl. .............................. 137/565.23; 137/565.3; 414/805
(58) Field of Classification Search ................. 414/217, 414/935; 137/565.23, 565.3, 565.35, 605; 438/488

See application file for complete search history.

(56) References Cited

U.S. PATENT DOCUMENTS

| 5,455,082 A | 10/1995 | Saito et al. |
| 5,611,486 A | 3/1997 | Paul |
| 5,833,425 A | 11/1998 | Jeon et al. |
| 6,217,633 B1 | 4/2001 | Ohmi et al. |
| 6,247,531 B1 | 6/2001 | Cowans |
| 6,478,035 B1 | 11/2002 | Niuya et al. |
| 6,953,739 B2 | 10/2005 | Yang et al. |
| 6,984,362 B2 | 1/2006 | Hara et al. |
| 2003/0045098 A1 | 3/2003 | Verhaverbeke et al. |
| 2005/0103264 A1 | 5/2005 | Jansen |
| 2005/0189074 A1 | 9/2005 | Kasai et al. |
| 2006/0099053 A1 | 5/2006 | Saito |
| 2006/0121211 A1 | 6/2006 | Choi |
| 2007/0009649 A1 | 1/2007 | Nakamura et al. |
| 2007/0212846 A1 | 9/2007 | Yokouchi |

*Primary Examiner*—Charles A Fox
(74) *Attorney, Agent, or Firm*—Portland IP Law, LLC

(57) ABSTRACT

An apparatus includes a transfer unit under an atmospheric condition and having a robot therein; and at least one process chamber connected to one side of the transfer unit with a slot valve there between, and being alternately under a vacuum condition and under an atmospheric condition.

22 Claims, 11 Drawing Sheets

VACUUM PUMPING SYSTEM, DRIVING METHOD THEREOF, APPARATUS HAVING THE SAME, AND METHOD OF TRANSFERRING SUBSTRATE USING THE SAME

CROSS-REFERENCE TO RELATED APPLICATION

This application is a Divisional Application of the U.S. application Ser. No. 11/076,512, which claims priority of Korean Patent Applications No. 2004-0015544 filed on Mar. 8, 2004, No. 2004-0017627 filed on Mar. 16, 2004, No. 2004-0017832 filed on Mar. 17, 2004, and No. 2005-0014819 filed on Feb. 23, 2005, which are hereby incorporated by references.

BACKGROUND OF THE INVENTION

1. Field of the Invention

The present invention relates to a vacuum pumping system, a driving method thereof, an apparatus having the same, and a method of transferring a substrate using the same.

2. Discussion of the Related Art

In general, a semiconductor device or a liquid crystal display (LCD) device is fabricated by repeating a deposition step of a thin film on a substrate, a photolithographic step using a photoresist, a selective etch step of the thin film and a cleaning step of the substrate several times or several ten times. These steps for a fabrication process of a semiconductor device or an LCD device may be performed using an apparatus having a process chamber under optimum condition.

Recently, a cluster including process chambers for treating substrates, a load-lock chamber for storing the substrates temporarily and a transfer chamber for moving the substrates into and out of the process chambers between the process chambers and the load-lock chamber has been widely used as an apparatus for fabricating a semiconductor device and an LCD device because of its superior treatment capability of large number of substrates in a short time period.

FIG. 1 is a schematic view showing a cluster according to the related art. The cluster may be used for manufacturing an LCD device as well as a semiconductor device.

In FIG. 1, a cluster includes a transfer chamber 70, a plurality of process chambers 80, first and second load-lock chambers 40 and 50, a transfer unit 10 and first and second load ports 20 and 30. The plurality of process chambers 80 and the first and second load-lock chambers 40 and 50 are connected to respective sides of the transfer chamber 70. The transfer unit 10 is connected to sides of the first and second load-lock chambers 40 and 50, and the first and second load ports 20 and 30 are connected to a side of the transfer unit 10.

Generally, a deposition step of a thin film on a substrate, an etch step of the thin film and a cleaning step of the substrate are carried out in the process chambers 80 under a high vacuum condition. The transfer chamber 70 serves as a space for transferring the substrate between one process chamber and another process chamber 80 or between one of the process chambers 80 and one of the load-lock chambers 40 and 50 using a transfer chamber robot 72. The transfer chamber 70 also keeps a vacuum condition. Slot valves (not shown) are set up between each process chamber 80 and the transfer chamber 70.

The transfer unit 10 may be referred to as an equipment front end module (EFEM). The transfer unit 10 serves as a space for moving an untreated substrate into the load-lock chambers 40 and 50 or for moving a treated substrate out of the load-lock chambers 40 and 50 into the outside using a robot 12 therein. The transfer unit 10 always keeps an atmospheric condition and is connected to the first and second load ports 20 and 30 with doors (not shown) disposed therebetween. Cassettes taking in substrates are disposed in the load ports 20 and 30.

An aligner 60 for flat zone alignment of a substrate disposed on the robot 12 may be equipped at a side of the transfer unit 10.

The first and second load-lock chambers 40 and 50 are disposed as a buffer between the transfer chamber 70 and the transfer unit 10 because the transfer chamber 70 is under a vacuum condition and the transfer unit 10 is under an atmospheric condition. The first and second load-lock chamber 40 and 50 are alternately under a vacuum condition and an atmospheric condition when the substrate goes in and out.

Slot valves are set up between the first and second load-lock chambers 40 and 50 and the transfer unit 10 and between the first and second load-lock chambers 40 and 50 and the transfer chamber 70.

Cassettes taking in substrates are disposed in the first load port 20 and the second load port 30, and the robot 12 transfers a substrate from one of the first load port 20 and the second load port 30 into the transfer unit 10. Next, after the robot 12 achieves flat zone alignment of the substrate in the align 60, the robot 12 transfers the substrate into one of the first and second load-lock chambers 40 and 50.

For example, if a door (not shown) of the first load-lock chamber 40 is open, the robot 12 loads the substrate in the first load-lock chamber 40. Then, when the robot 12 turns back, the door is closed, and a pumping step is performed to convert the first load-lock chamber 40 from the atmospheric condition into the same vacuum condition as the transfer chamber 70.

When the first load-lock chamber 40 is under the vacuum condition, a door (not shown) between the first load-lock chamber 40 and the transfer chamber 70 is open, and the transfer chamber robot 72 goes into the first load-lock chamber 40 to move the substrate into one of the process chambers 80.

After the substrate is treated in the process chamber 80, the substrate is taken out in reverse order of the above-mentioned processes. At this time, the substrate is transferred out of the transfer chamber 70 into the load-lock chamber 40 or 50, and then a step for venting the load-lock chamber 40 or 50 is performed to change the load-lock chamber 40 or 50 from the vacuum condition to the atmospheric condition. After the venting step, the robot 12 of the transfer unit 10 takes out the substrate in the load-lock chamber 40 or 50 and transfers the substrate into the cassette in the load port 20 or 30.

By the way, the cluster according to the related art requires a transfer chamber 70 under a vacuum condition and at least one load-lock chamber 40 or 50 so as to connect the process chambers 80 under a high vacuum condition and the outside under an atmospheric condition. This causes a large footprint of the cluster and high costs of the cluster due to the transfer chamber 70 and the transfer chamber robot 12.

Meanwhile, as stated above, because the load-lock chamber 40 or 50 is alternately under a vacuum condition and an atmospheric condition and the process chambers 80 and the transfer chamber 70 are always under a vacuum condition, the cluster should include a vacuum pumping system and a venting system.

FIG. 2 is a schematic view of a process chamber, a vacuum pumping system and a venting system according to the related art. As shown in the figure, a susceptor 87 is disposed within the process chamber 80 to load a substrate thereon, and a gas injection unit 84 such as a showerhead is disposed over the susceptor 87. The gas injection unit 84 is connected to a process gas storing unit 86 via a gas line 85 passing through a chamber lid 81 of a dome shape. An injector, which passes through a sidewall or a lower side of the process chamber 80 and protrudes within the process chamber 80, may be used as the gas injection unit 84. The chamber lid 81 may have various shapes without limitation on the dome shape.

A turbo molecular pump (TMP) 90 is disposed under the process chamber 80, and a pendulum valve 83 is disposed between the process chamber 80 and the TMP 90.

The vacuum pumping system includes a first exhaust line 91, a booster pump 98, a dry pump 99, and a second exhaust line 92. One end of the first exhaust line 91 is connected to a low part of the process chamber 80, and the booster pump 98 and the dry pump 99 are connected to the other end of the first exhaust line 91. One end of the second exhaust line 92 is connected to the TMP 90, and the other end of the second exhaust line 92 is connected to the first exhaust line 91 ahead of the booster pump 98.

The dry pump 99 may be referred to as a roughing pump and may be widely used under pressure conditions from atmospheric pressure to about 1 mTorr (millitorr). The dry pump 99 is classified into a CAM type and a screw type.

As schematically illustrated in FIG. 3, the booster pump 98 includes a cylinder 98a and two rotors 98b of a cocoon shape in the cylinder 98a, wherein the rotors 98b are uniformly rotated in opposite directions by driving gears at axes thereof, respectively.

Therefore, gases coming into an intake of the booster pump 98 are exhausted toward an outlet due to rotation of the rotors 98b, tightly closed in a space between the cylinder 98a and the rotors 98b, and the gases are gone out into the air through an additional pump, for example, the dry pump 99 of FIG. 2, behind of the booster pump 98.

Since a narrow gap of about 0.1 mm to about 0.3 mm is kept between the rotors and between the rotor and the cylinder, lubricating oil is not necessary. Thus, there is an advantage of vacuum exhaustion without oil.

A slow pumping line 93 extends from a fast pumping line 91, that is, the first exhaust line 91. Because the slow pumping line 93 has a smaller cross-sectional area than the first exhaust line 91, the slow pumping line 93 has a relatively low exhaust conductance and a relatively slow pumping speed as compared with the first exhaust line 91. If the pumping speed is fast at an early stage of pumping, the substrate and components of the apparatus may be damaged. Accordingly, the slow pumping line 93 is used to reduce the damages.

A three-way valve 96 is equipped between the process chamber 80 and the booster pump 98 so that the slow pumping line 93 diverges from the first exhaust line 91. One end of the slow pumping line 93 is connected to one outlet of the three-way valve 96, and the other end of the slow pumping line 93 is connected to the first exhaust line 91 between the booster pump 98 and the three-way valve 96. Therefore, an exhaust path of the gases is determined out of the slow pumping line 93 and the first exhaust line 91 by the three-way valve.

A middle valve 97 is disposed in the middle of the second exhaust line 92, and the middle valve 97 opens and shuts depending on working of the TMP 90.

To change the chamber under from the atmospheric condition to a vacuum condition using the above vacuum pumping system, the boost pump 98 and the dry pump 99, first, are driven, and gases are exhausted through the slow pumping line 93 by controlling the three-way valve 96. When the process chamber 80 is under a certain pressure, the three-way valve 96 is controlled again, and thus gases are exhausted through the first exhaust line 95 not the slow pumping line 93. At this time, the booster pump 98 and the dry pump 99 simultaneously work.

When the process chamber 80 is under a high vacuum condition, the pendulum valve 83 under the process chamber 80 is opened, and the process chamber 80 is pumped using the TMP 90 until the inside of the process chamber 80 is under an ultra high vacuum condition. Gases exhausted through the TMP 90 are exhausted through the booster pump 98 and the dry pump 99 via the middle valve 97 and the first exhaust line 93.

However, because the vacuum pumping system has a slow pumping speed, it is difficult to frequently use the vacuum pumping system, and the vacuum pumping system is widely used in a step for setting an apparatus.

Meanwhile, a venting system is commonly equipped for the load-lock chambers 40 and 50, which are alternately under the atmospheric condition and under the vacuum condition, and the venting system may be equipped for the process chamber 80 or the transfer chamber 70. That is, when the pressure in the process chamber 80 or the transfer chamber 70 become considerably low due to excessive vacuum pumping, the pressure in the process chamber 80 or the transfer chamber 70 should be adjusted by an optimum pressure by providing gases such as argon (Ar) or nitrogen (N2). Additionally, the chambers may be under the atmospheric condition in the case of immobilizing the apparatus for repair or in other needed case.

FIG. 2 shows the venting system of the process chamber 80. The venting system includes a venting line 88 and a needle valve 89. One end of the venting line 88 passes through the sidewall of the process chamber 80, and the other end of the venting line 88 is connected to a venting gas storing unit (not shown), which includes Ar or N2 gases therein. The needle valve 89 is set up in the middle of the venting line 88 and controls flow rate of the gases.

However, the related art venting system commonly adjusts the pressure of the chambers under the vacuum condition within narrow ranges. Thus, if the range of the adjusted pressure is widened, venting time should become longer.

If gases flow into the chamber in quantity to reduce the venting time, it is impossible to uniformly maintain the inner temperature of the chamber, and thus reproductivity of the processes is reduced. In addition, since degradation of the apparatus and generation of particles may be caused due to thermal impacts, there is limitation on periodically venting the process chamber during the processes.

SUMMARY OF THE INVENTION

Accordingly, the present invention is directed to a vacuum pumping system, a driving method thereof, an apparatus having the same, and a method of transferring a substrate using the same that substantially obviates one or more of the problems due to limitations and disadvantages of the related art.

An object of the present invention is to provide an apparatus of manufacturing a substrate for a semiconductor device and a liquid crystal display device that efficiently utilizes the apparatus by reducing a footprint and decreases costs for the apparatus.

Another object of the present invention is to provide a vacuum pumping system and a pumping method using the same that increase a pumping speed of a process apparatus.

Another object of the present invention is to provide a venting system and a venting method using the same that minimize temperature variation and thermal impacts inside a chamber increasing a venting speed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus includes a transfer unit under an atmospheric condition and having a robot therein; and at least one process chamber connected to one side of the transfer unit with a slot valve therebetween, and being alternately under a vacuum condition and under an atmospheric condition.

In another aspect, the apparatus further includes an exhaust line connected to the process chamber; a booster pump and a dry pump sequentially equipped to the exhaust line; and a bypass line detouring the booster pump, wherein one end of the bypass line is connected to the exhaust line between the booster pump and the dry pump, and the other end of the bypass line is connected to the exhaust line ahead of the booster pump. Moreover, the apparatus further includes a first three-way valve between the booster pump and the dry pump and a second three-way valve ahead of the booster pump, wherein the one end and the other end of the bypass line are connected to the first and second three-way valves, respectively.

In another aspect, the apparatus further includes at least one venting line connected to the process chamber and a venting gas storing unit; and a first heating unit set up in the middle of the at least one venting line.

In another aspect, the apparatus further includes at least one load port connected to another side of the transfer unit.

In another aspect, a method of loading a substrate includes carrying the substrate into a transfer unit under an atmospheric condition by using a robot set up in the transfer unit; transferring the substrate from the transfer unit into a process chamber under the atmospheric condition by using the robot; and vacuum pumping an inside of the process chamber. The vacuum pumping includes first pumping using a dry pump and second pumping using the dry pump and a booster pump simultaneously, wherein the booster pump and the dry pump are sequentially connected to the process chamber.

In another aspect, a method of unloading a substrate from a process chamber includes venting the process chamber such that an inside of the process chamber is changed from a vacuum condition into an atmospheric condition; transferring the substrate from the process chamber into a transfer unit under the atmospheric condition by using a robot in the transfer unit; and taking the substrate out of the transfer unit by using the robot.

In another aspect, a vacuum pumping system includes an exhaust line connected to a chamber; a booster pump and a dry pump sequentially connected to the exhaust line; and a bypass line detouring the booster pump, wherein one end of the bypass line is connected to the exhaust line between the booster pump and the dry pump, and the other end of the bypass line is connected to the exhaust line ahead of the booster pump. The system further includes a first three-way valve between the booster pump and the dry pump and a second three-way valve ahead of the booster pump, wherein the one end and the other end of the bypass line are connected to the first and second three-way valves, respectively.

In another aspect, a method of vacuum pumping an inside of a chamber using a booster pump and a dry pump sequentially set up in an exhaust line includes first pumping using the dry pump; and second pumping using the dry pump and the booster pump simultaneously.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
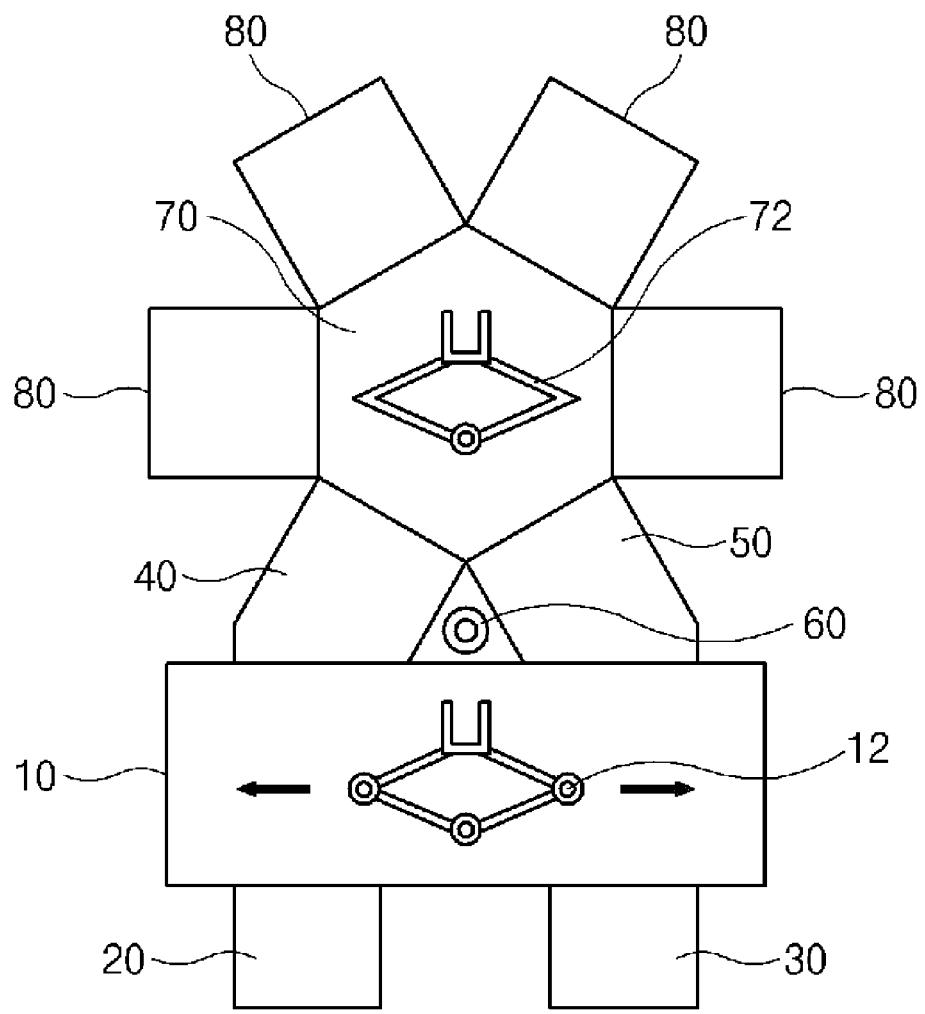
FIG. 1 is a schematic view showing a cluster according to the related art.
Figure 2:
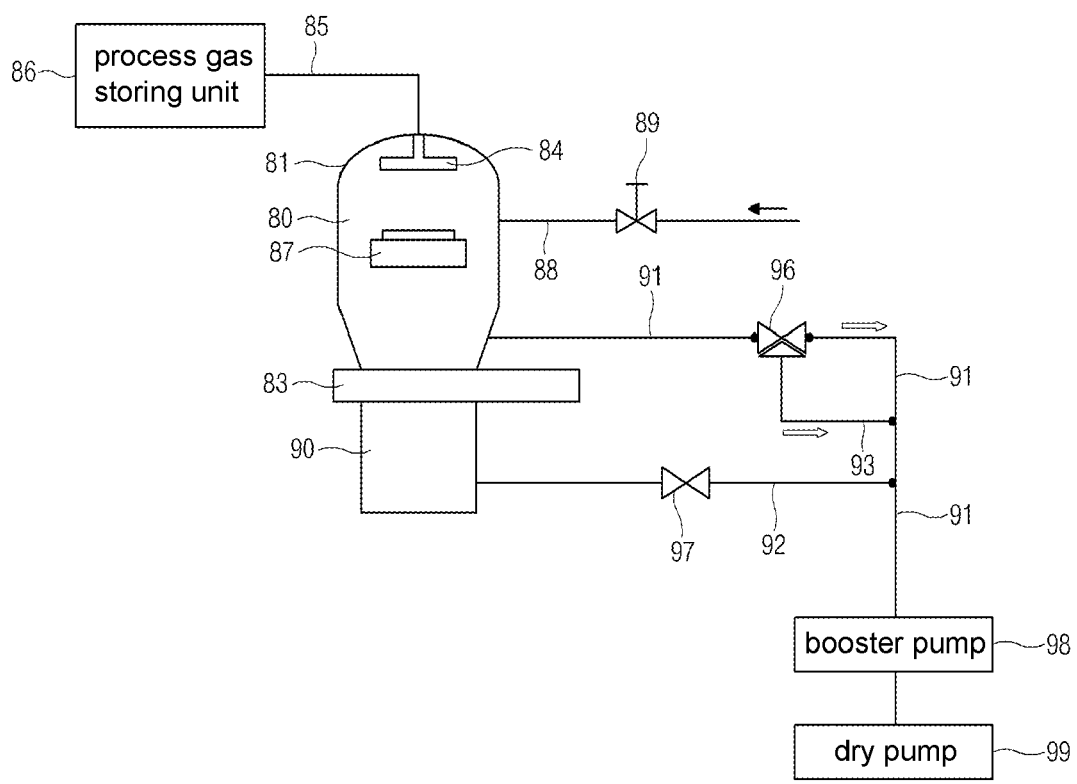
FIG. 2 is a schematic view of a process chamber, a vacuum pumping system and a venting system according to the related art.
Figure 3:
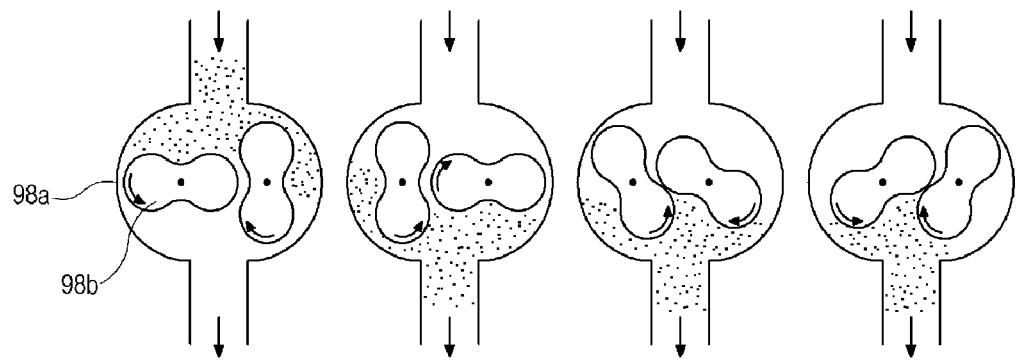
FIG. 3 is a schematic view showing the mechanism of a booster pump.

Reference will now be made in detail to the preferred embodiments, examples of which are illustrated in the accompanying drawings.

FIGS. 4A to 4E are views schematically showing examples of a process apparatus according to the present invention. As shown in the figures, the apparatus includes a transfer unit 10, a plurality of process chambers 100, and first and second load ports 20 and 30. The transfer unit 10 is under an atmospheric condition and has a robot 12 therein. The process chambers 100 and the first and second load ports 20 and 30 are connected to sides of the transfer unit 10. The number of the process chambers 80 and the number of the load ports 20 and 30 may be changed.

The apparatus excludes a transfer chamber, a transfer chamber robot and load-lock chambers 40 and 50 as compared to the apparatus of the related art of FIG. 1. In the present invention, the transfer unit 10 further acts as the related art transfer chamber 70, and the process chambers 100 further function as the load-lock chambers 40 and 50, which act as a buffer between a vacuum condition and an atmospheric condition.

To do this, the apparatus includes a vacuum pumping system and a venting system according to the present invention different from those of the related art, and the vacuum pumping system and the venting system will be explained later.

The robot 12 of the transfer unit 12 transfers a substrate into each process chamber and carries out the substrate, and thus a transfer guide (not shown) is desirably set up for moving the robot 12 in the transfer unit 12. Arrows shown in the transfer unit 10 designates moving direction of the robot 12 moving according to the transfer guide.

The robot 12 may perform only a rotary motion or may perform the rotary motion and a linear motion simultaneously depending on arrangement of the transfer unit 10 and the process chambers 100. On the other hand, the transfer chamber robot 72 of the related art performs only the rotary motion.

As stated above, cassettes taking in substrates are disposed in the load ports 20 and 30. A slot valve 110 is set up between each process chamber 100 and the transfer unit 10 to open and close a moving path of the substrate. A door (not shown) may be beneficially set up for isolation from the outside between the transfer unit 10 and each load port 20 and 30.

Figure 4A:
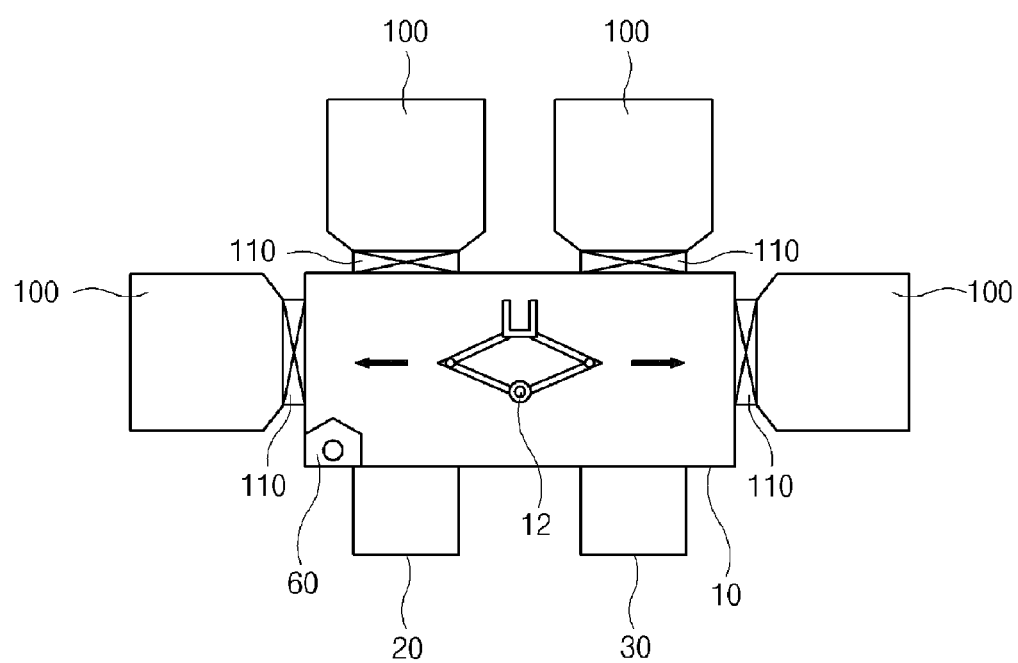
FIGS. 4A to 4E are views schematically showing examples of a process apparatus according to the present invention.
Figure 4B:
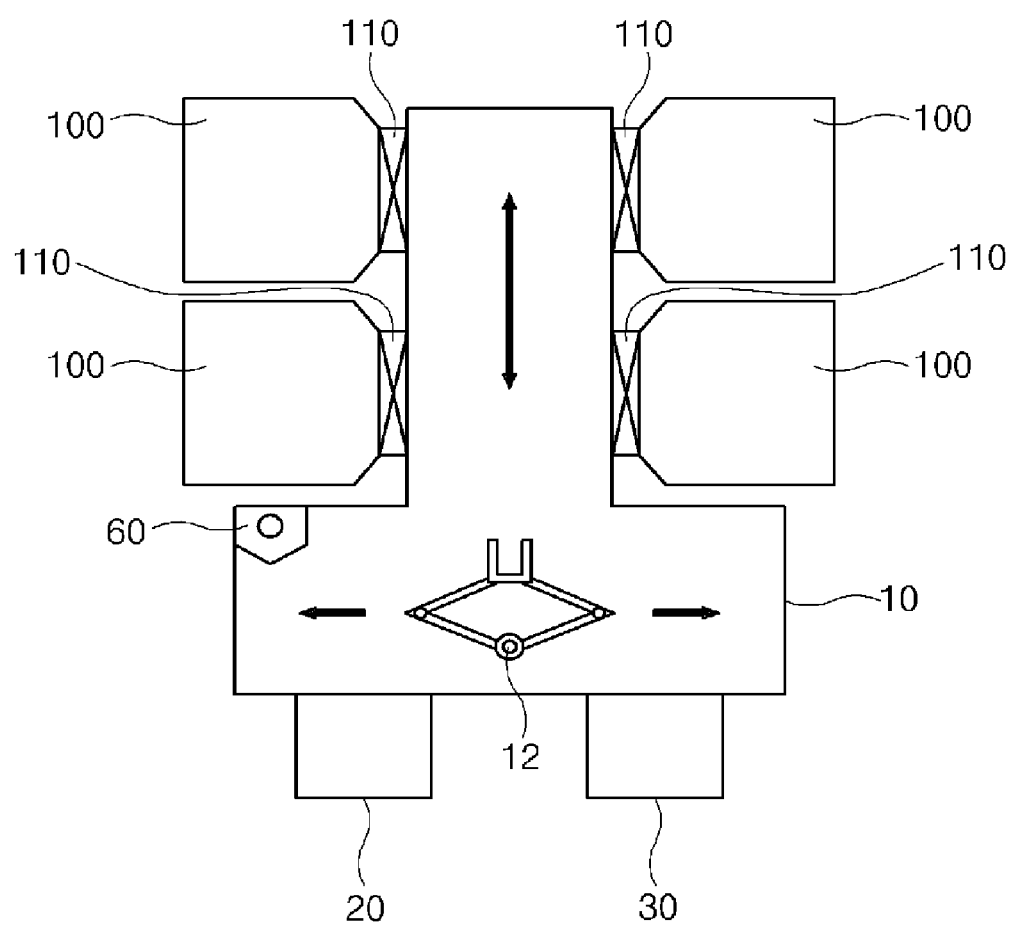
Figure 4C:
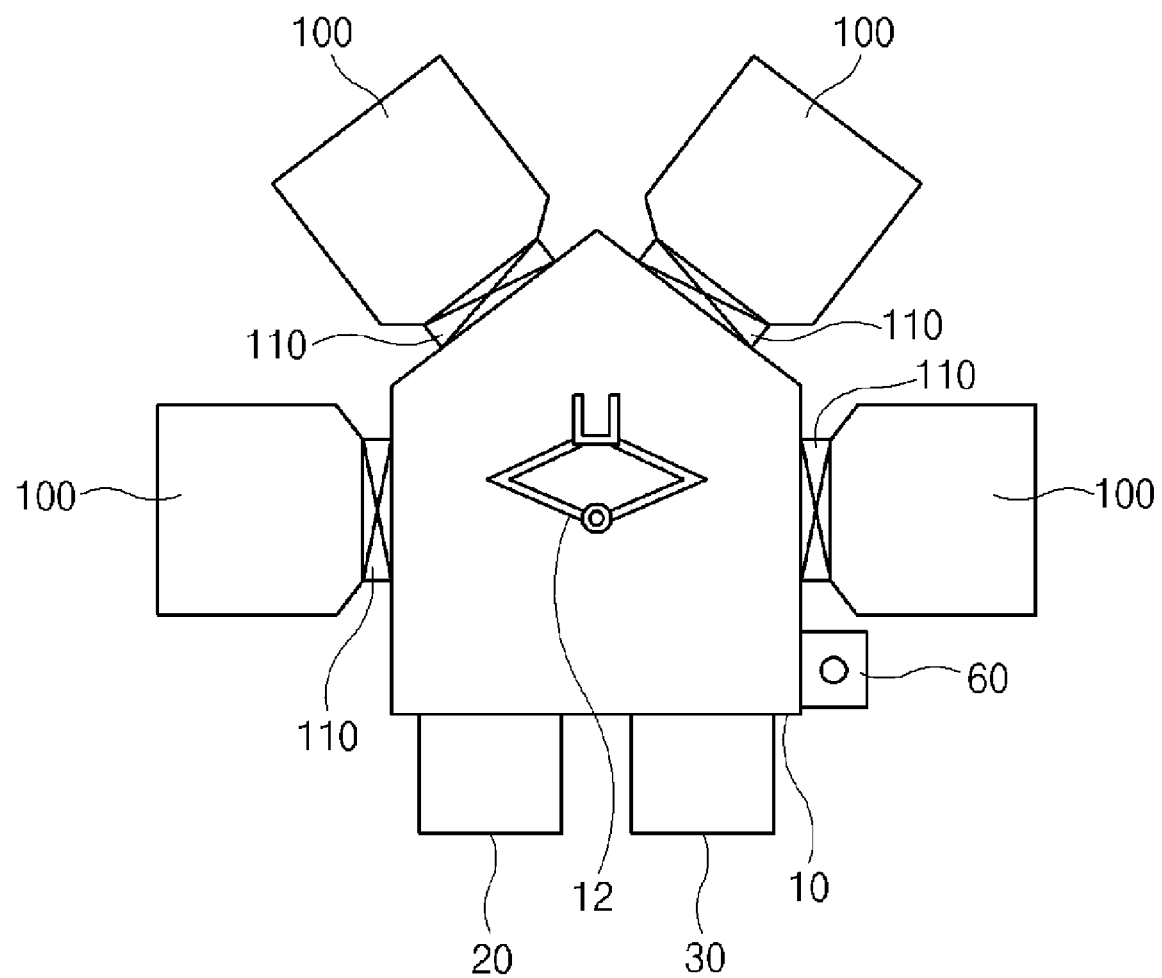
Figure 4D:
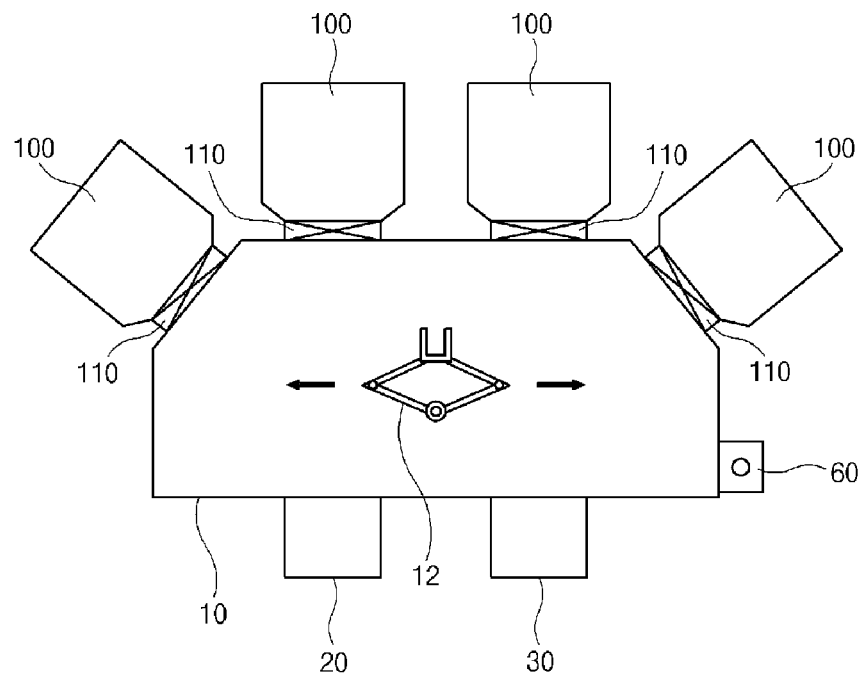
Figure 4E:
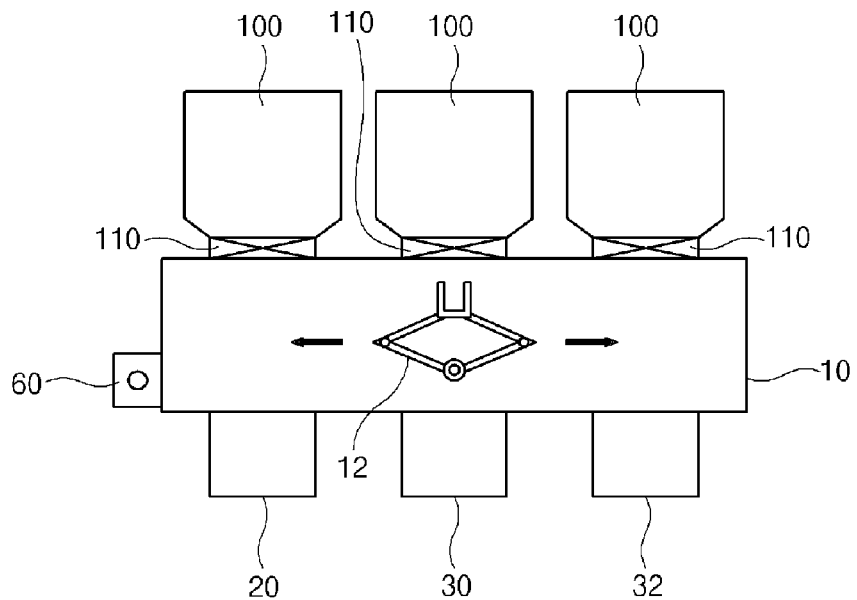

An aligner 60 aligns the substrate laid on the robot 12. The aligner 60 may be included as a part of the transfer unit 10 as illustrated in FIGS. 4A and 4B or may be combined with a side portion of the transfer unit 10 as illustrated in FIGS. 4C to 4E. The aligner 40 may be omitted in a case that the substrate is aligned beforehand or in other cases.

As shown in FIGS. 4A to 4E, the transfer unit 10 may have various shapes according to circumstances, and thus a variety of footprints may be deduced. At this time, the transfer guide (not shown) of the robot 12 may be also changed properly depending on the shape of the transfer unit 10. Because the transfer unit 10 is not an airtight space under a vacuum condition, the number of robots may be increased and the process chambers may be stacked freely from restraint on spaces. Accordingly, the transfer unit 10 is set up so that there is no bottleneck space, and processes can be simultaneously carried out in several process chambers 100 to thereby increase productivity.

The apparatus of FIG. 4E further includes a third load port 32, and the number of load ports is three. The number of load ports may be changed.

In the apparatus where the process chambers 100 and the atmospheric transfer unit 10 are directly connected, processes of loading the substrate into the process chambers 100 and of unloading the substrate out of the process chambers 100 will be explained hereinafter with reference to FIG. 4A.

First, the robot 12 of the transfer unit 10 carries a substrate from one of the first and second load ports 20 and 30 into the transfer unit 10, and the robot 12 loads the substrate in one of the process chambers 100 after aligning the substrate in the aligner 60 if necessary.

The transfer chamber 10 is always under the atmospheric condition, and thus the inside of the process chamber 100 should become an atmospheric condition when the substrate is carried into the process chamber 100. Accordingly, a step of venting the process chamber 100 is performed so that the inside of the process chamber 100 is under the atmospheric condition before opening the slot valve 110.

When the process chamber is under the atmospheric condition, the slot valve 110 is opened, and the robot 12 including the substrate thereon goes into the process chamber 100 to thereby load the substrate on the susceptor (not shown).

After loading the substrate, the robot 12 comes out of the process chamber 100, and the slot valve 110 is closed. A vacuum pumping is carried out so that the process chamber 100 is under a vacuum condition, and next processes are performed by injecting process gases after achieving a desired vacuum condition.

After the processes, the substrate is unloaded out of the process chamber 100. First, to convert the inside of the process chamber 100 from the vacuum condition to the atmospheric condition, a step of venting the process chamber 100 is performed by injecting gases such as nitrogen or argon. When the process chamber 100 is under the atmospheric condition, the slot valve 110 is opened, and the robot 12 goes into the process chamber 100 through the slot valve 110. The robot 12 transfers the treated substrate from the process chamber 100 into the transfer unit 10. Next, the robot 12 takes the substrate out of the transfer unit 10 into one of the first and second load ports 20 and 30 to thereby lay the substrate in the cassette (not shown).

In the apparatus, the atmospheric condition and the vacuum condition should alternate every time when exchanging substrates. To make proper conditions quickly, the following vacuum pumping system may be used.

The vacuum pumping system is devised from the point that the maximum range of a pumping speed varies depending on methods of using vacuum pumps.

Figure 5:
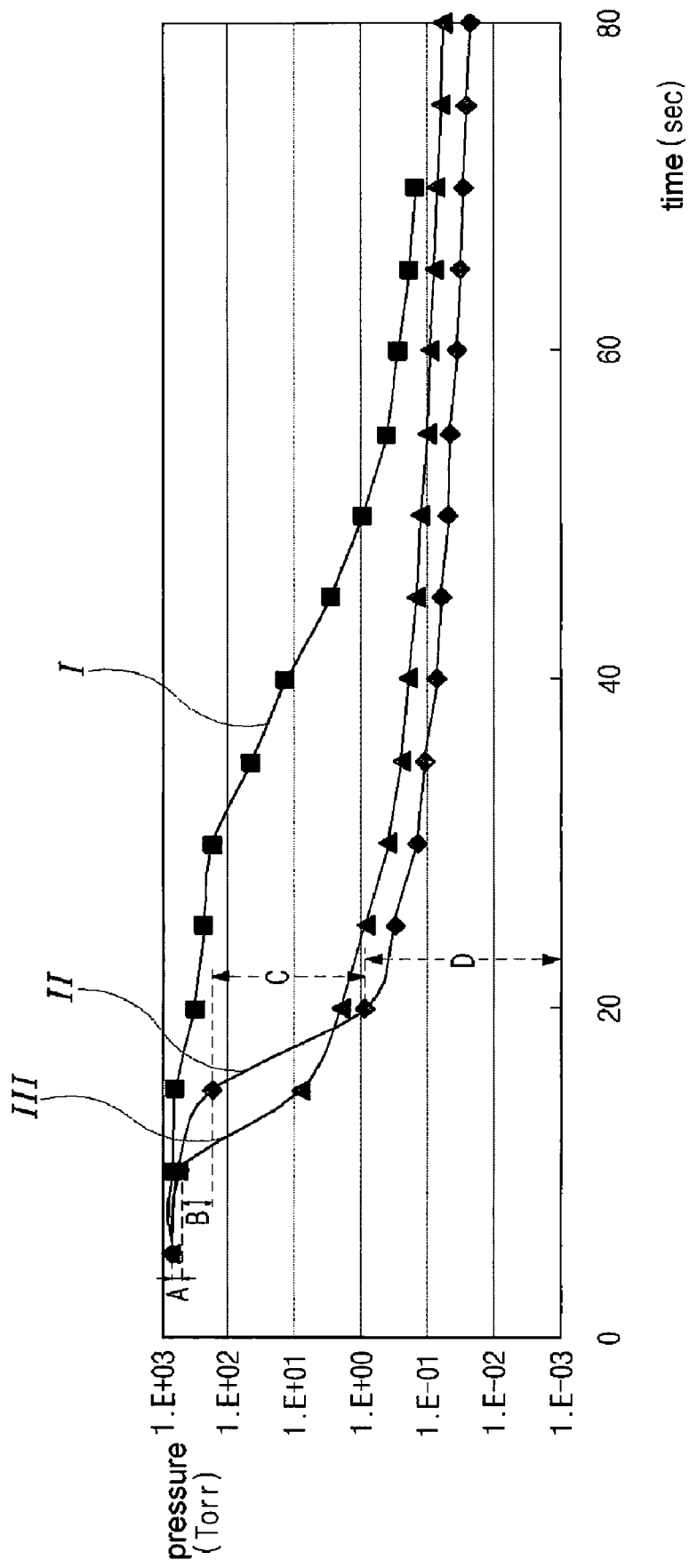
FIG. 5 is an experimental graph illustrating pumping speeds.

FIG. 5 is an experimental graph illustrating pumping speeds. In FIG. 5, a curve I shows pumping speeds in a case of slow pumping using a booster pump and a dry pump, which are sequentially set up to an exhaust line of a chamber, and a curve II and a curve III show pumping speeds in a case of slow pumping early and then fast pumping after a certain pressure. In the case of the curve II, the booster pump and the dry pump are operated, and in the case of the curve III, only the dry pump is used.

The slow pumping and the fast pumping are comparative concepts, and it is desirable that the pumping speed is relatively slow so as to reduce damages on the substrate in the process chamber. However, since the pumping speed is very slow as noticed from the curve I, it is difficult to frequently apply the slow pumping during the processes.

Therefore, the slow pumping is performed in the early stage of the pumping, and the fast pumping is carried out after achieving a pressure less than a predetermined value to thereby increase a pumping speed.

When the slow pumping is changed to the fast pumping, there is no difference among the pumping speeds of the cases in the region A. In the region B, the case of the curve III, in which only the dry pump is used, has the fast pumping speed according as the pressure gets lower. That is, it is good in the pumping speed to pump using the dry pump early.

However, the above-stated difference between the pumping speeds maintains within a pressure range from the atmospheric pressure to about 100 Torr or about 300 Torr. While the case of the curve III using only the dry pump has a slow slope less than the above pressure, the case of the curve II using the booster pump and the dry pump together has a uniform slope, so that the case of the curve II achieves the pressure of about 1 Torr earlier than the case of the curve III. Accordingly, it is beneficial to operate the booster pump and the dry pump together within a pressure range of 100 Torr or 300 Torr to about 1 Torr.

In the region D, that is, in a high vacuum region less than about 1 Torr, the pumping speeds are irrelevant to using the booster pump, and beneficially, a turbo molecular pump is widely used.

Slopes of curves and values of the pressure may be varied depending on sizes of the apparatus, and analogous results are obtained.

Figure 6:
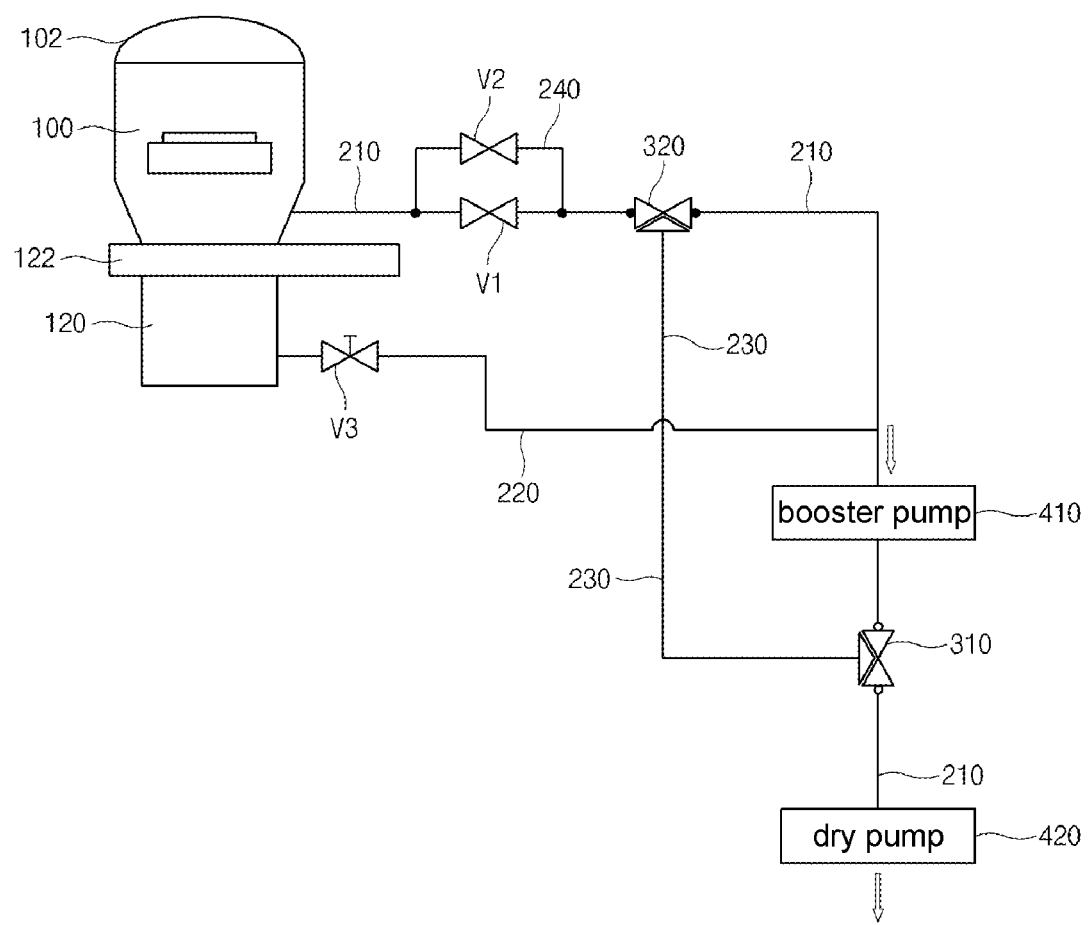
FIG. 6 is a view illustrating an apparatus including a vacuum pumping system according to an embodiment of the present invention.

FIG. 6 is a view illustrating an apparatus including a vacuum pumping system according to an embodiment of the present invention. The vacuum pumping system maximizes a whole pumping speed using the difference between the pumping speeds of the above regions.

A process chamber 100 of FIG. 6 may have the same constitution as that of the related art and may have other constitution.

Therefore, a chamber lid 102 is combined with an upper portion of the process chamber 100, and a turbo molecular pump 120 is set up under the process chamber 100 with a pendulum valve 122 interposed there between. One end of a first exhaust line 210 is connected to a lower portion of the process chamber 100, and a booster pump 410 and a dry pump 420 are sequentially equipped with the other end of the first exhaust line 210.

One end of a second exhaust line 220 is connected to the turbo molecular pump 120, and the other end of the second exhaust line 220 is connected to the first exhaust line 210 ahead of the booster pump 410.

In the present invention, a path bypassing the booster pump 410 is further formed such that gases are exhausted by using only the dry pump 420 early not through the booster pump 410 and then are exhausted by using the booster pump 410 and the dry pump 420 after a predetermined pressure.

To do this, a bypass line 230 extends from the first exhaust line 210 ahead of the booster pump 410. At this time, in FIG. 6, a first three-way valve 310 having two inlets is equipped between the booster pump 410 and the dry pump 420, and a second three-way valve 320 is set up ahead of the booster pump 410. One end of the bypass line 230 is connected to one inlet of the first three-way valve 310, and the other end of the bypass line 230 is connected to one outlet of the second three-way valve 320. Therefore, gases are selectively exhausted through the first exhaust line 210 or the bypass line 230 by controlling the first and second three-way valves 310 and 320.

A first valve V1 is set up ahead of the second three-way valve 320, and a second valve V2 is equipped in a slow pumping line 240 by connecting the slow pumping line 240 detouring the first valve V1 to the first exhaust line 210 so that slow pumping may be performed in the early stage to prevent the substrates and components of the chamber from being damaged due to fast pumping. The slow pumping line 240 has a smaller cross-sectional area than the first exhaust line 210 and have relatively low exhaust conductance. The slow pumping line 240 may be omitted.

A third valve V3 is set up in the second exhaust line 220. Although not shown in the figure, a pressure gauge sensing the inner pressure of the chamber and a controller automatically regulating opening and shutting of the first and second three-way valves 310 and 320 are further equipped to selectively control driving of the pump or paths of the gases according to the inner pressure of the chamber.

In the vacuum pumping system, first, the pendulum valve 122 and the third valve V3 are OFF, that is, is closed, and the turbo molecular pump 12 may be either ON or OFF. The booster pump 410 is OFF, and the dry pump 420 is ON. Because the booster pump 410 is isolated by the first and second three-way valves 310 and 320, the booster pump 410 may be ON.

Next, gases are exhausted through the bypass line 230 by controlling the first and second three-way valves 310 and 320.

If the slow pumping is performed in the early stage, the first valve V1 is OFF, and the second valve V2 is ON. An outlet of the second three-way valve 320 toward the bypass line 230 is ON, so that the gases are exhausted through the slow pumping line 240, the bypass line 230 and the dry pump 420.

The slow pumping is performed until the inner pressure of the chamber becomes about 500 Torr for about 10 seconds. More time may be spent in the slow pumping if the apparatus has a larger size.

When the inner pressure of the chamber reaches about 500 Torr, to increase the pumping speed, the first valve V1 is ON, and the second valve V2 is OFF, thereby performing the fast pumping.

In the fast pumping, the booster pump 410 is not used, and only the dry pump 420 is operated. The fast pumping is carried out until the inner pressure of the chamber becomes about 100 to about 300 Torr and corresponds to the region B of FIG. 5.

When the inner pressure of the chamber reaches about 100 to 300 Torr, the booster pump 410 is ON, and the outlet of the second three-way valve 320 toward the bypass line 230 is OFF, whereby the gases are exhausted through the first exhaust line 210, the booster pump 410 and the dry pump 420. This step corresponds to the region C of FIG. 5 and is carried out until the inner pressure of the chamber becomes about 1 Torr.

Under the pressure less than about 1 Torr, for ultra high vacuum pumping, the pendulum valve 122 and the third valve V3 are ON, and an inlet of the second three-way valve 320 is OFF. Thus, gases are exhausted through the turbo molecular pump 120.

Figure 7:
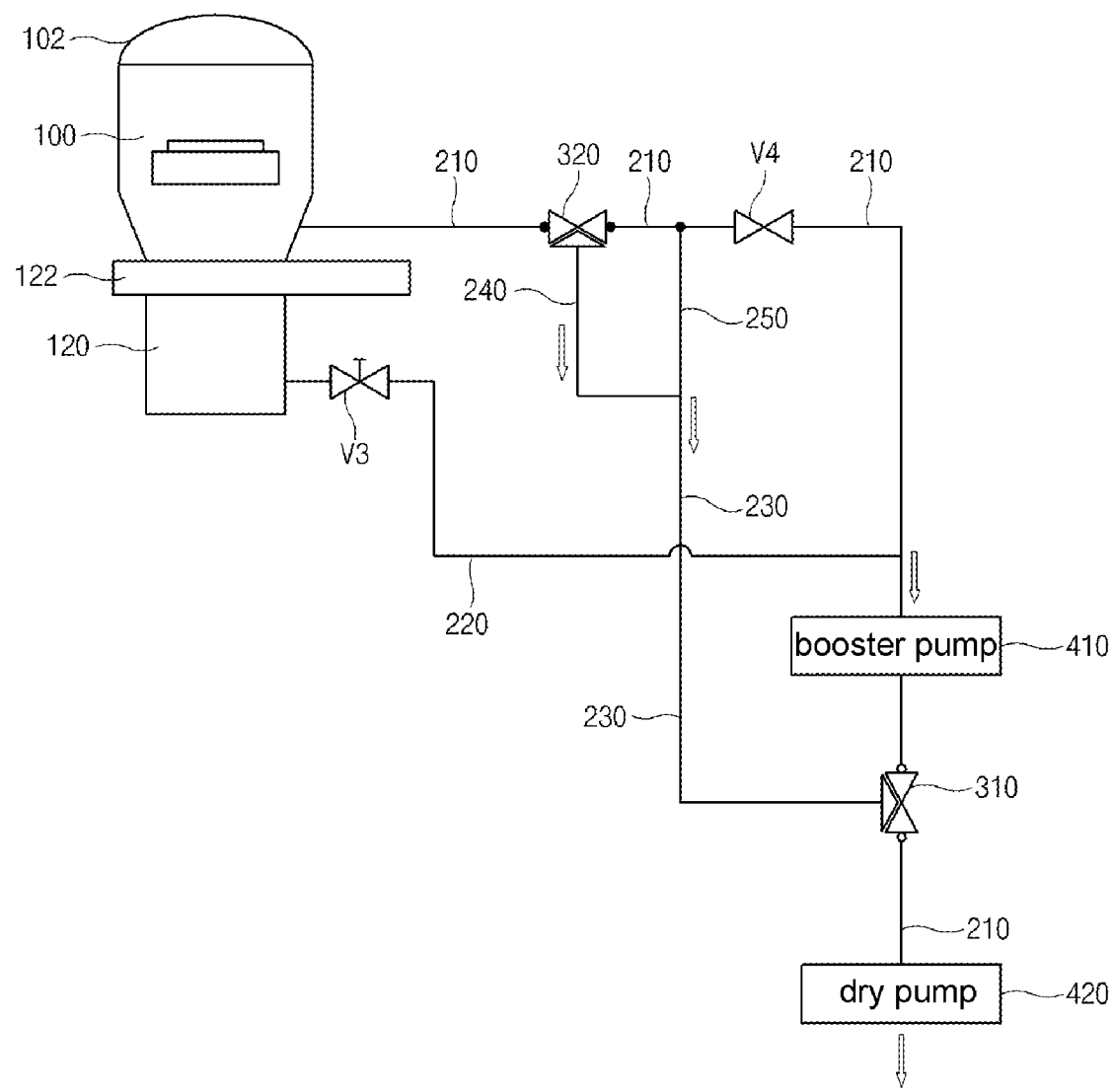
FIG. 7 is a view illustrating an apparatus including a vacuum pumping system according to another embodiment of the present invention.

FIG. 7 is a view illustrating an apparatus including a vacuum pumping system according to another embodiment of the present invention. In FIG. 7, a first exhaust line 210 is connected to a lower portion of a process chamber 100, and a booster pump 410 and a dry pump 420 are sequentially equipped to the first exhaust line 210. A first three-way valve 310 is set up between the booster pump 410 and the dry pump 420.

A fourth valve V4 is equipped ahead of the booster pump 410 to isolate the boost pump 410. A slow pump line 240 and a fast pumping line 250 branch off from the first exhaust line 210 ahead of the fourth valve V, respectively, and are connected to one end of a bypass line 230. At this time, the slow pumping line 240 has a smaller cross-sectional area than the fast pumping line 250. The other end of the bypass line 230 is connected to the first three-way valve 310. Here, a second three-way valve 320 is used for divergence of the slow pumping line 240. The fast pumping line 250 extends from the first exhaust line 210 behind of the second three-way valve 320.

Hereinafter, a vacuum pumping process using the vacuum system of FIG. 7 will be explained laying stress on differences from that of FIG. 6.

In FIG. 7, the fourth valve V4 is set up in the first exhaust line 210 for isolating the booster pump 410. Thus, if the fourth valve V4 is OFF, gases are exhausted through the bypass line 230, the first three-way valve 310 and the dry pump 420. When the fourth valve V4 is OFF, the booster pump 410 may be OFF or may be ON.

If a slow pumping step is performed early, an outlet of the first three-way valve 320 toward the slow pumping line 240 is ON, and then the slow pumping is carried out until a pressure of the chamber becomes about 500 Torr. After that, the outlet of the first three-way valve 320 toward the slow pumping line 240 is OFF, and an outlet of the first three-way valve 320 toward the first exhaust line 210 is ON. At this time, the fourth valve V4 is OFF, and the gases are exhausted into the bypass line 230 through the fast pumping line 250.

When the pressure of the chamber reaches about 100 to 300 Torr, an inlet of the first three-way valve 310 toward the bypass line 230 is OFF, and the fourth valve V4 is ON. At the same time, if the booster pump 410 if OFF, the booster pump 410 should be ON. Accordingly, the gases are exhaust through the first exhaust line 210, the booster pump 410 and the dry pump 420.

Next, under the pressure less than about 1 Torr, the pendulum valve 122 and the second valve V2 are ON, and the inlet of the second three-way valve 320 is OFF, whereby the gases are exhausted through the turbo molecular pump 120.

Figure 8:
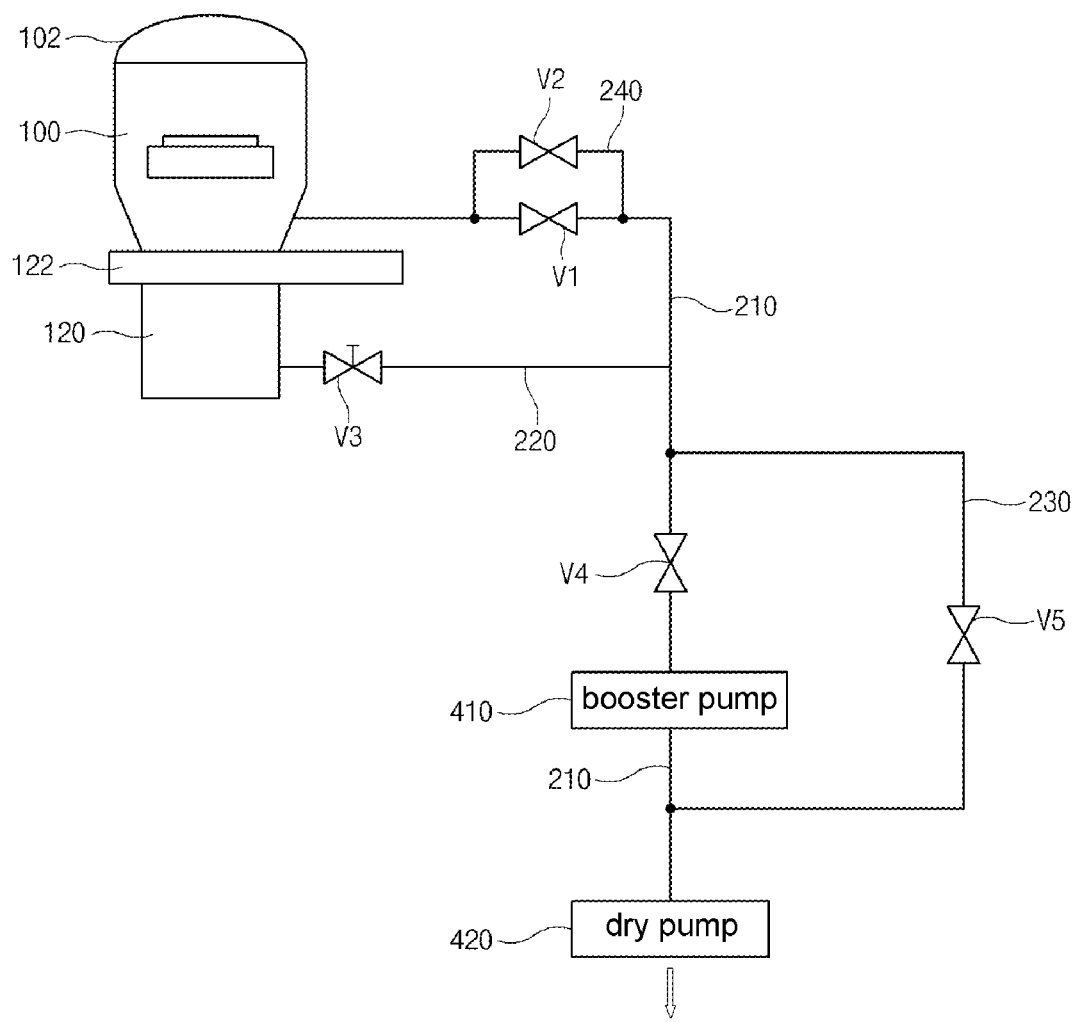
FIG. 8 is a view illustrating an apparatus including a vacuum pumping system according to another embodiment of the present invention.

FIG. 8 is a view illustrating an apparatus including a vacuum pumping system according to another embodiment of the present invention. The apparatus of FIG. 8 has the same structure as those of FIGS. 6 and 7 as follows: a booster pump 410 and a dry pump 420 are sequentially equipped to a first exhaust line 210 connected to a lower portion of a process chamber 100, a bypass line 230 detouring the booster pump 410 is set up in the first exhaust line 210, and a second exhaust line 220 connects a turbo molecular pump 120 and the first exhaust line 210.

However, in addition to first, second and third valves V1, V2 and V3, the apparatus of FIG. 8 further includes a fourth valve V4 and a fifth valve V5. In the apparatus of FIG. 8, an exhaust path of the gases is selected according to ON/OFF states of the fourth valve V4 and the fifth valve V5 differently from the cases of FIGS. 6 and 7 using first and second three-way valve.

The fourth valve V4 is set up in the first exhaust line 210 ahead of the booster pump 410 to isolate the booster pump 410. The bypass line 230 diverges from the first exhaust line 210 ahead of the fourth valve V4 and is connected to the first exhaust line 210 behind of the booster pump 410.

The first valve V1 and a slow pumping line 240 are set up in the first exhaust line 210 ahead of the point at which the bypass line 230 diverges from the first exhaust line 210. The slow pumping line 240 detours the first valve V1, and the second valve V2 is equipped in the slow pumping line 240. As stated above, the slow pumping line 240 has a smaller cross-sectional area than the first exhaust line 210.

The third valve V3 is set up in the second exhaust line 220. In addition, controllers are needed to automatically control ON/OFF of the valves and the booster pump. An isolation valve may be further set up in the first exhaust line 210 behind of the booster pump 410, and in this case, it is not necessary to control ON/OFF of the booster pump.

In a pumping process using the vacuum pumping system of FIG. 8, first, the inside of the chamber is isolated fro the outside, and the pendulum valve 122 and the third valve V3 are OFF. At this time, the turbo molecular pump 120 may be ON or may be OFF. The booster pump 410 is OFF, and the dry pump 420 is ON.

Next, the first valve V1 and the fifth valve V5 are ON, and the second valve V2 and the fourth valve V4 are OFF. Thus, the gases are exhausted through the first exhaust line 210, the bypass line 230 and the dry pump 420.

Meanwhile, to perform a slow pumping step early, the second valve V2 may be ON, and the first valve V1 may be OFF. In this case, the slow pumping step may be performed until the pressure of the chamber becomes about 500 Torr considering the pumping speed. After that, the second valve V2 is OFF, and the first valve V1 is ON. Thus, a fast pumping step is carried out until the pressure of the chamber becomes about 100 to 300 Torr. Also, in the fast pumping step, only the dry pump 420 is used for exhausting gases.

When the pressure of the chamber is under about 100 to 300 Torr, the fifth valve V5 is OFF, and the booster pump 410 and the fourth valve V4 are ON. Accordingly, the gases are exhausted through the first exhaust line 210, the booster pump 410 and the dry pump 420.

Under the pressure less than about 1 Torr, the first and second valves V1 and V2 are OFF, and the pendulum valve 122 and the third valve V3 are ON, thereby exhausting the gases using the turbo molecular pump 120 for ultra high vacuum pumping. Here, the fifth valve V5 still is OFF.

The vacuum pumping system may be also used for the transfer chamber or the load-lock chambers of the relate art apparatus of FIG. 1.

Other methods for controlling ON/OFF of the valves and the pumps may be used such that the dry pump is used in the early stage and the booster pump is used together with the dry pump after that to thereby provide an exhaust path.

Meanwhile, a venting system may be set up so that the process chamber is under an atmospheric condition from a vacuum condition.

Figure 9:
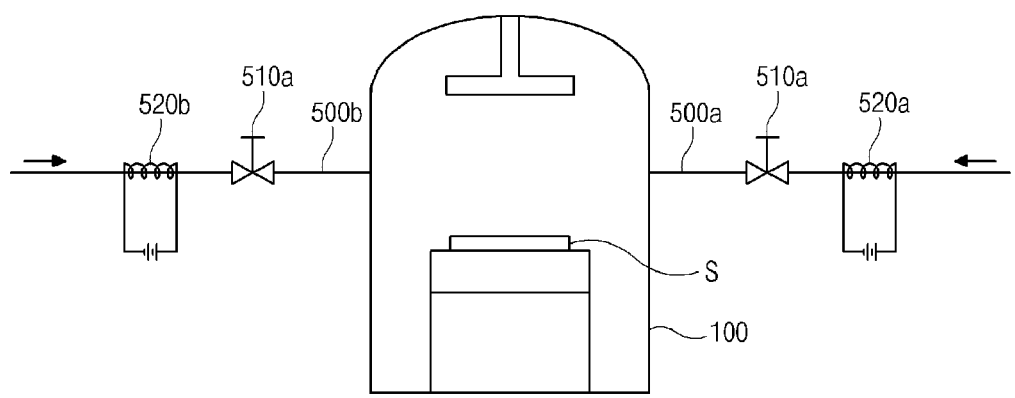
FIG. 9 is a view illustrating an apparatus including a venting system according to an embodiment of the present invention.

FIG. 9 is a view illustrating an apparatus including a venting system according to an embodiment of the present invention. In FIG. 9, one end of a first venting line 500a passes through and is connected to a first sidewall of a chamber 100, and one end of a second venting line 500b is connected to a second sidewall of the chamber 100 opposite to the first sidewall of the chamber 100. The other ends of the first and second venting lines 500a and 500b are connected to venting gas storing units (not shown). Argon (Ar) or nitrogen (N2) gases may be used as the venting gas. The number of venting gas storing units may be one, and thus the first and second venting lines 500a and 500b may be connected to one venting gas storing unit. The first and second venting lines 500a and 500b may be connected to respective venting gas storing units.

A first heating unit 520a and a second heating unit 520b are equipped in the middles of first venting line 500a and the second venting line 500b, respectively. The first and second heating units 520a and 520b preheat the venting gases by temperatures close to the process temperature in the process chamber and inject the venting gases. Thus, the inner temperature of the chamber is prevented from rapidly changing due to the venting, and thermal impacts are minimized.

That is, uniformity and reproductivity of the processes are very important in performing deposition and etching processes of a thin film, the process temperature has a large influence on the uniformity and the reproductivity of the processes. In the present invention, a variation of the process temperature due to injection of the venting gases is minimized by the heating unit.

In FIG. 9, the first and second heating units 520a and 520b may be resistance coils enclosing the first and second venting lines 500a and 500b, respectively. In addition to the resistance coils, heat exchangers of other shapes may be used.

To minimize turbulence of the venting gases injected into the chamber, the venting lines 500a and 500b are symmetrically arranged.

The needle valve may be selectively set up either ahead of the heating unit or behind of the heating unit. The needle valve controls flow rates of the gases considering the temperature of the chamber, the temperature of the venting gases and the pressures in total.

Figure 10:
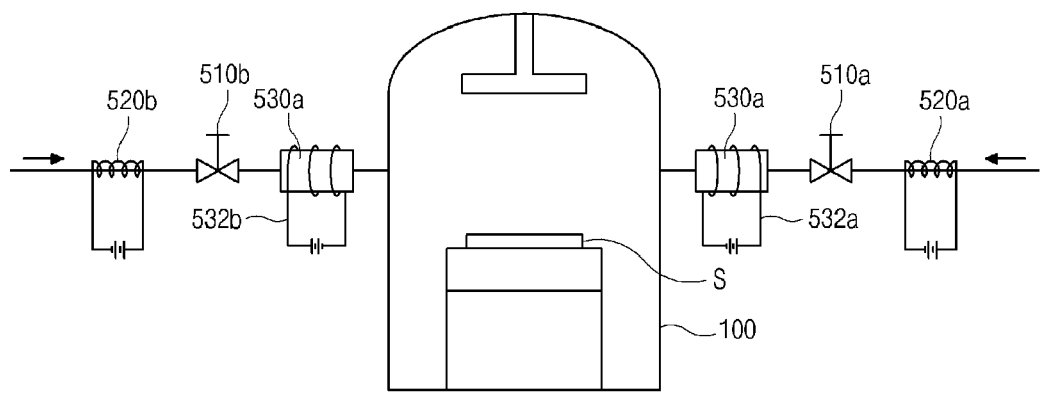
FIG. 10 is a view illustrating an apparatus including a venting system according to another embodiment of the present invention.

FIG. 10 is a view illustrating an apparatus including a venting system according to another embodiment of the present invention. The apparatus of FIG. 10 further includes first and second expansion units 530a and 530b between the first and second heating units 520a and 520b and the chamber 100 as compared to the apparatus of FIG. 9.

The first and second expansion units 530a and 530b reduce pressures and flow speeds of the venting gases to prevent the venting gases of high pressure from being directly injected into the chamber. In FIG. 10, the expansion units 530a and 530b are a can shape having a larger diameter than the venting lines 500a and 500b, and the expansion units 530a and 530b may have other shapes.

Additionally, the temperatures of the venting gases may be lowered due to expansion to thereby have an influence upon the temperature in the inside of the chamber. To prevent this problem, third and fourth heating units 532a and 532b may reheat the expanded venting gases. In FIG. 10, the third and fourth heating units 532a and 532b may be resistance coils surrounding the first and second expansion units 530a and 530b, and heat exchangers of other shapes may be used as the expansion units 530a and 530b like the first and second heating units 520a and 520b.

In FIG. 10, one expansion unit is combined with one venting line 500a or 500b, and more two expansion units may be connected with one venting line according to the pressures of the venting gases or conditions inside the chamber.

A process of injecting the venting gases through the venting system will be explained with reference to FIG. 10.

First, venting gases flowing into the venting lines 500a and 500b are preheated by the first and second heating units 520a and 520b. After the preheated venting gases passes through the needle valves 510a and 510b, the preheated venting gases are first expanded in the first and second expansion units 530a and 530b, and thus the pressures and the flow rates thereof are reduced.

To compensate drops of the temperatures due to the expansion, the venting gases are reheated in the first and second expansion units 530a and 530b by using the third and fourth heating units 532a and 532b, and thus the reheated venting gases are injected into the chamber.

By using the venting system of the present invention, the venting speed may be increased, and the temperature variation or the turbulence in the chamber may be minimized.

Since the apparatus of manufacturing a semiconductor device or an LCD device according to the present invention excludes a transfer chamber, a transfer chamber robot and load-lock chambers under a vacuum condition, footprint of the apparatus is decreased, and thus costs of the apparatus are reduced.

Additionally, pumping time of the process chamber from the atmospheric condition to the vacuum condition is shortened, and venting time is reduced minimizing the temperature variation. Therefore, productivity of the apparatus is largely improved.

It will be apparent to those skilled in the art that various modifications and variations can be made in the apparatus without departing from the spirit or scope of the invention. Thus, it is intended that the present invention covers the modifications and variations of this invention provided they come within the scope of the appended claims and their equivalents.

What is claimed is:

1. A vacuum pumping system comprising:
an exhaust line connected to a chamber;
a booster pump and a dry pump sequentially connected to the exhaust line;
a bypass line detouring the booster pump, wherein one end of the bypass line is connected to the exhaust line between the booster pump and the dry pump, and the other end of the bypass line is connected to the exhaust line ahead of the booster pump; and
a first three-way valve between the booster pump and the dry pump and a second three-way valve ahead of the booster pump, wherein the one end and the other end of the bypass line are connected to the first and second three-way valves, respectively, wherein a valve is disposed between the second three-way valve and the booster pump and a slow pumping line is connected to the second three-way valve and the bypass line, and wherein the slow pumping line has a smaller diameter than the bypass line.

2. The system according to claim 1, wherein a first valve for isolating the booster pump is equipped between a divergence point of the bypass line diverging from the exhaust line and the booster pump, and a second valve is set up in the bypass line.

3. The system according to claim 1, wherein a first valve for isolating the booster pump is equipped between a divergence point of the bypass line diverging from the exhaust line and the booster pump, and a second valve is set up in the bypass line.

4. The system according to claim 1, further comprising at least one venting line connected to the process chamber and a venting gas storing unit; and a first heating unit set up in the middle of the at least one venting line.

5. The system according to claim 1, wherein the apparatus includes more than two venting lines connected to the process chamber symmetrically with respect to a center of the process chamber.

6. A vacuum pumping system comprising:
at least one venting line connected to a process chamber and a vacuum gas storing unit; and
a first heating unit set up in the middle of the at least one venting line, wherein a valve is set up in the at least one venting line between the first heating unit and the process chamber, and at least one expansion unit is equipped between the valve and the process chamber.

7. A method of vacuum pumping an inside of a chamber in a vacuum pumping system comprising: an exhaust line connected to the chamber; a booster pump and a dry pump sequentially connected to the exhaust line; a bypass line detouring the booster pump, wherein one end of the bypass line is connected to the exhaust line between the booster pump and the dry pump, and the other end of the bypass line is connected to the exhaust line ahead of the booster pump; and a first three-way valve between the booster pump and the dry pump and a second three-way valve ahead of the booster pump, wherein the one end and the other end of the bypass line are connected to the first and second three-way valves, respectively, the method comprising:
first pumping using the dry pump; and
second pumping using the dry pump and the booster pump simultaneously.

8. The method according to claim 7, wherein the second pumping is performed when an inside pressure of the chamber becomes about 100 Torr to about 300 Torr.

9. The method according to claim 7, wherein the first pumping is performed so that gases are exhausted through the bypass line by controlling the first and second three-way valves when the dry pump is ON and the booster pump is OFF.

10. The method according to claim 7, wherein the first pumping is performed so that the booster pump is isolated by the first and second three-way valves when the booster pump is ON.

11. The method according to claim 7, wherein a slow pumping line is connected to the second three-way valve and the bypass line.

12. The method according to claim 11, wherein the first pumping includes a slow pumping performed until an inside pressure of the chamber becomes 500 Torr and a fast pumping performed until an inside pressure of the chamber becomes 100 to 300 Torr.

13. The method according to claim 12, wherein the slow pumping is performed so that gases are exhausted through the slow pumping line, the bypass line and the dry pump.

14. The method according to claim 12, wherein the fast pumping is performed so that gases are exhausted through the exhaust line, the bypass line and the dry pump.

15. The method according to claim 11, wherein the slow pumping line has a smaller diameter than the bypass line.

16. The method according to claim 7, wherein the second pumping is performed so that gases are exhausted through the exhaust line, the booster pump and the dry pump.

17. The method according to claim 7, wherein a valve is disposed between the second three-way valve and the booster pump.

18. The method according to claim 7, wherein a first valve for isolating the booster pump is equipped between a divergence point of the bypass line diverging from the exhaust line and the booster pump, and a second valve is set up in the bypass line.

19. The method according to claim 7, wherein the vacuum pumping system includes at least one venting line connected to the process chamber and a venting gas storing unit; and a first heating unit set up in the middle of the at least one venting line.

20. The method according to claim 19, wherein the vacuum pumping system includes at least one expansion unit is equipped between the valve and the process chamber.

21. The method according to claim 20, wherein a second heating unit is connected to the at least one expansion unit.

22. The method according to claim 7, wherein the vacuum pumping system includes more than two venting lines connected to the process chamber symmetrically with respect to a center of the process chamber.

* * * * *